United States Patent
Kao (10) Patent No.: US 7,022,565 B1
(45) Date of Patent: Apr. 4, 2006

(54) METHOD OF FABRICATING A TRENCH CAPACITOR OF A MIXED MODE INTEGRATED CIRCUIT

(75) Inventor: Jung-Cheng Kao, Shanghai (CN)

(73) Assignee: Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 10/996,361

(22) Filed: Nov. 26, 2004

(51) Int. Cl.
*H01L 21/8238* (2006.01)

(52) U.S. Cl. ............... 438/210; 438/218; 438/219; 438/221; 438/231; 438/239; 438/240; 438/243; 438/244; 438/294; 438/295; 438/296; 438/305; 438/307; 438/308; 438/386; 438/387; 438/405; 438/424; 438/427; 438/430; 438/435; 438/437; 438/453

(58) Field of Classification Search ............ 438/210, 438/218, 219, 221, 239, 243, 386, 405, 427, 438/430
See application file for complete search history.

(56) References Cited

U.S. PATENT DOCUMENTS

| | | | |
|---|---|---|---|
| 4,419,812 A * | 12/1983 | Topich ............... 438/238 |
| 5,913,126 A * | 6/1999 | Oh et al. ............... 438/393 |
| 6,103,622 A * | 8/2000 | Huang ............... 438/652 |
| 6,165,861 A * | 12/2000 | Liu et al. ............... 438/382 |
| 6,306,720 B1 * | 10/2001 | Ding ............... 438/391 |
| 6,373,083 B1 * | 4/2002 | Oh ............... 257/296 |
| 6,468,855 B1 * | 10/2002 | Leung et al. ............... 438/239 |
| 6,492,224 B1 * | 12/2002 | Jao ............... 438/241 |
| 6,664,580 B1 * | 12/2003 | Jao ............... 257/296 |
| 6,825,078 B1 * | 11/2004 | Huang ............... 438/242 |
| 6,964,895 B1 * | 11/2005 | Hsu ............... 438/238 |
| 2003/0036228 A1 * | 2/2003 | Jao ............... 438/200 |
| 2005/0139887 A1 * | 6/2005 | Song ............... 257/296 |

* cited by examiner

*Primary Examiner*—Lynne A. Gurley
(74) *Attorney, Agent, or Firm*—Rosenberg, Klein & Lee (57) ABSTRACT

A method of fabricating a trench capacitor of a mixed mode integrated circuit includes forming shallow trench isolation regions for isolating active/passive devices on a semiconductor substrate. The lower electrode layer of the polysilicon layer, the dielectric layer, and the upper electrode layer are formed in sequence in a plurality of shallow trench isolation regions to form a trench capacitor. The present invention uses a trench capacitor to substitute for the 3-dimensional structure capacitor to overcome the disadvantages of the conventional capacitor, resulting in increasing the surface area of electrode and the capacitance.

9 Claims, 7 Drawing Sheets

METHOD OF FABRICATING A TRENCH CAPACITOR OF A MIXED MODE INTEGRATED CIRCUIT

BACKGROUND OF THE INVENTION

1. Field of the Invention

The present invention relates to a fabrication method of semiconductor devices, and more particularly, to a method of fabricating a trench capacitor of a mixed mode integrated circuit.

2. Description of the Prior Art

Mixed mode integrated circuits comprise digital devices, such as an amplifier and an Analogy/Digital converter, and analog devices, such as an adder, in the logic area of the semiconductor chip. Mixed mode integrated circuits also comprise devices composed of MOS and capacitors.

Figure 1:
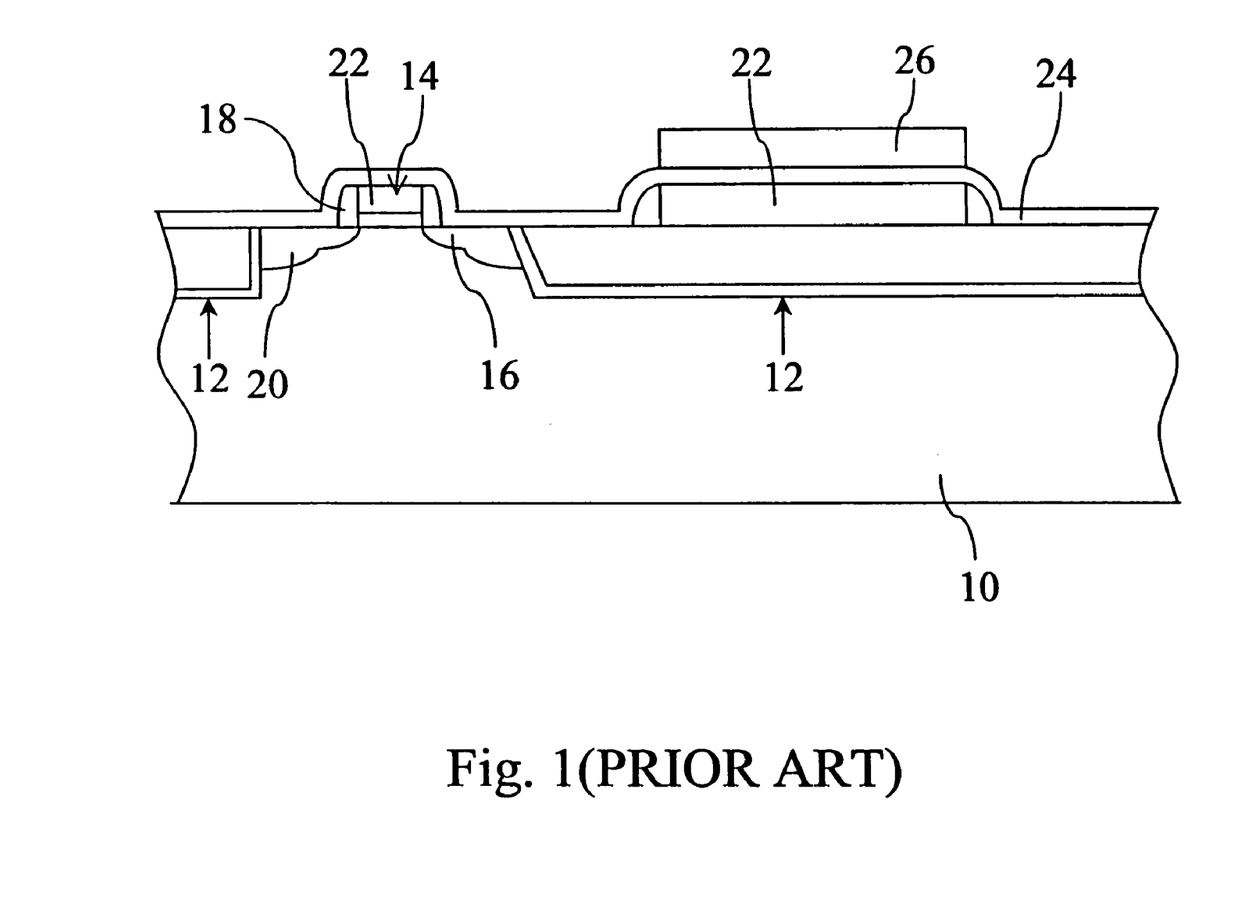
FIG. 1 is a schematic diagram illustrating a trench capacitor according to the conventional mixed mode integrated circuit.

It is known in the art to form a capacitor of a mixed mode integrated circuit, as shown in FIG. 1. Shallow trench isolation regions (STI) 12, the transistor gate structure 14, the lightly doped source/drain regions 16, the gate spacers 18 and the heavily doped source/drain regions 20 are formed in sequence on a semiconductor substrate 10. The deposited first polysilicon layer is used to form a transistor gate structure 14, and also used to form a lower electrode layer 22 of the capacitor. A dielectric layer 24 is deposited on the lower electrode layer 22 of the first polysilicon layer. A second polysilicon layer 26 is deposited thereon for an upper electrode layer of the capacitor. First polysilicon layer 22, the dielectric layer 24 and second polysilicon layer 26 form a PIP (poly insulator poly) capacitor structure.

The capacitance of the capacitor increases by increasing the surface area of the electrode. Due to the dielectric material with a high dielectric constant or the reduced thickness of dielectric layer, a dielectric layer with high dielectric ability is formed. However, in order to not generate a dielectric fault, the reduced thickness of the dielectric layer is limited. Therefore, the conventional method of increasing the capacitance is usually achieved by increasing the surface area of the electrode, or using a dielectric layer with a high dielectric constant.

In order to increase the surface area of the electrode, the conventional method uses a 3-dimensional structure, such as a cylindrical structure, or increases the height and uses the hemi spherical grain of polysilicon material for increasing the effective area of the lower electrode layer. However, the cylindrical shaped or the hemi spherical grain of polysilicon are difficult to apply in the process. This method causes the increase of the lower electrode layer height and has the obvious variation between the peripheral circuit and the lower electrode. This variation of topology increases the difficulty in the subsequence process.

In view of this, the present invention provides a method of fabricating a trench capacitor of a mixed mode integrated circuit in order to overcome the above-mentioned disadvantages.

SUMMARY OF THE INVENTION

The present invention provides a method of fabricating a trench capacitor of a mixed mode integrated circuit, which forms a capacitor in the shallow trench isolation by PIP (poly insulator poly) or PIM (poly insulator metal) in order to increase the surface area of the capacitor electrode.

The present invention also provides a method of fabricating a trench capacitor of a mixed mode integrated circuit, which uses a trench capacitor to substitute for the 3-dimensional structure capacitor in order to reduce the variation between the height of the lower electrode layer and the height of the peripheral circuit.

The present invention also provides a method of fabricating a trench capacitor of a mixed mode integrated circuit, which is a simplified and easy to control process.

According to a preferred embodiment of the present invention, a method of fabricating a trench capacitor of a mixed mode integrated circuit is provided. A first shallow trench isolation region and a second shallow trench isolation region are formed in a semiconductor substrate. A first patterned photoresist layer is formed on the semiconductor substrate to expose the second shallow trench isolation region only. The oxide layer in the second shallow trench isolation region is removed to leave several shallow trenches. The first patterned photoresist layer is then removed. The gate structure, the source/drain region of the basic devices are formed on the first shallow isolation region while forming a polysilicon layer used as a lower electrode on the second shallow trench isolation region, thereby covering the surface of the shallow trench. A dielectric layer and an upper electrode layer are formed on the semiconductor substrate. The exposed upper electrode layer on the first shallow trench isolation region is removed by using a second patterned photoresist layer as a mask, thereby forming a trench capacitor on the first polysilicon layer, the dielectric layer and the second polysilicon layer in the shallow trench structure.

These and other objectives of the present invention will become obvious to those of ordinary skill in the art after reading the following detailed description of the preferred embodiment.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION OF THE PREFERRED EMBODIMENTS

The conventional process uses a cylindrical shaped or a hemi spherical grain structure of the upper electrode layer to increase the surface area of electrode. In addition to increased difficulty in the process, the subsequent process is also more complex and harder to control. The present invention uses a trench capacitor to substitute for the 3-dimensional structure capacitor to overcome the disadvantages of the conventional capacitor, resulting in increasing the surface area of the electrode and reducing the difficulty of the subsequent process.

FIGS. 2a through 2e are sectional diagrams illustrating a trench capacitor of a mixed mode integrated circuit according to an embodiment of the present invention. As shown in the drawings, the present invention provides a fabrication method, comprising providing a semiconductor substrate 30 having first shallow trench isolation regions 32 and second shallow trench isolation regions 34 formed therein. The oxide on each trench isolation region 32 or 34 comprises a dielectric oxide layer 36 and a liner oxide layer 38. First shallow trench isolation region 32 is used for isolating the active area and the passive area in the semiconductor substrate 30. Second shallow trench isolation region 34 is used for forming a trench capacitor.

Figure 2A:
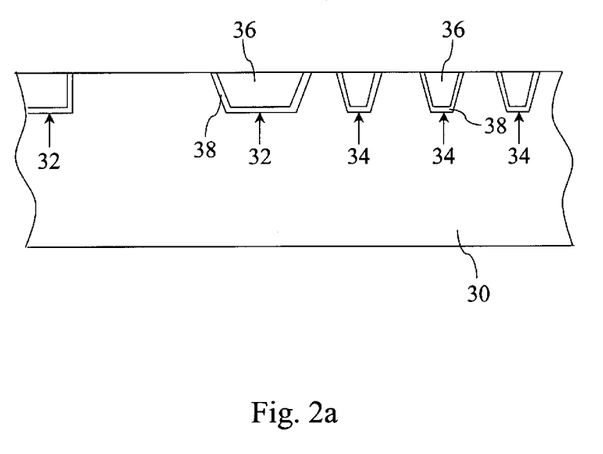
FIGS. 2a through 2e are sectional diagrams illustrating a trench capacitor of a mixed mode integrated circuit according to an embodiment of the present invention.
Figure 2B:
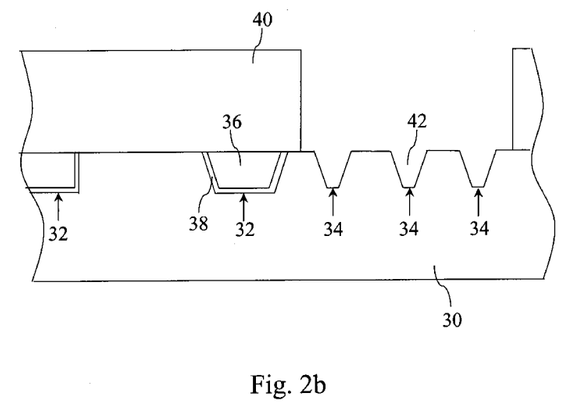

As shown in FIG. 2b, a first patterned photoresist layer 40 is formed on the semiconductor substrate 30 covering first shallow trench isolation regions 32 to expose second shallow trench isolation region 34 of the desired capacitor only. Using the first patterned photoresist layer 40 as a mask, the dielectric oxide layer 36 and the liner oxide layer 38 in second shallow trench isolation region 34 are removed by a wet etching to only leave several shallow trench structures 42. After finishing this step, first patterned photoresist layer 40 is removed.

Figure 2C:
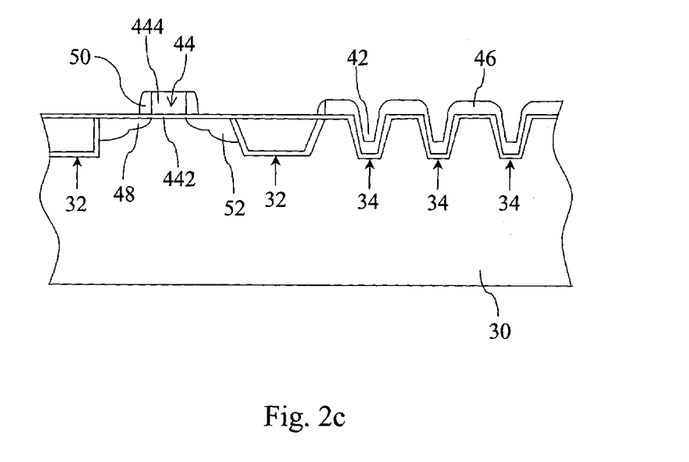

Next, the semiconductor basic devices are fabricated. As shown in FIG. 2c, a transistor gate structure 44 is formed between first shallow trench isolation regions 32 on the semiconductor substrate 30. The transistor gate structure 44 comprises a gate oxide layer 442 used for a lower layer, and a polysilicon layer 444 used for an upper layer. While forming the polysilicon layer 444 of the gate structure 44, a first polysilicon layer 46 is deposited on second shallow trench isolation region 34, and first polysilicon layer 46 covers the inner surface of the shallow trench structure 42 used for a lower electrode of the capacitor. Using the gate structure 44 as a mask, a first ion implantation with low concentration is performed to form a lightly doped source/drain region 48. Gate spacers 50 are formed on two sidewalls of the gate structure 44. After forming the lightly doped source/drain region 48, a high-temperature activation treatment is performed to recombine the silicon lattice of the semiconductor substrate surface. After this step, using the gate structure 44 and the gate spacer 50 as a mask, a second ion implantation with high concentration is performed to form a heavily doped source/drain region 52. A rapid thermal annealing is performed to anneal to the original crystal status on the semiconductor substrate surface by the amorphous silicon phenomenon produced by the ion implantation. So far, the basic devices on the semiconductor substrate are formed.

Figure 2D:
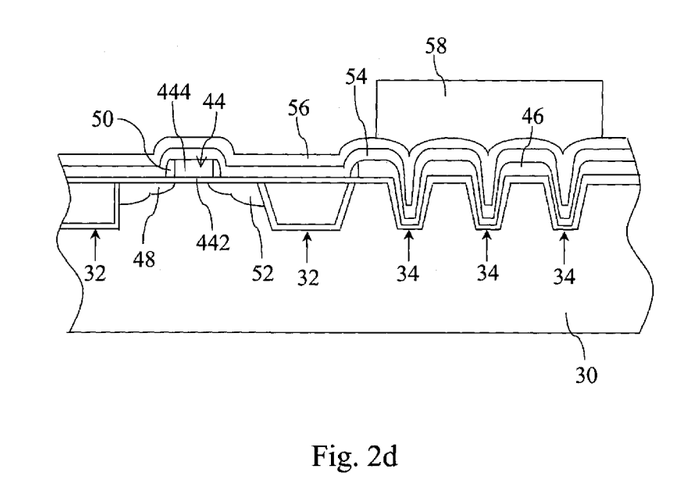

After forming the transistor gate structure 44 and first polysilicon layer 46 (the lower electrode) of the trench capacitor, the dielectric layer and the upper electrode layer of the capacitor are fabricated. As shown in FIG. 2d, a dielectric layer 54 is formed on the surface of the semiconductor substrate 30. A second polysilicon layer 56 is formed on the surface of the dielectric layer 54 used for an upper electrode of the second polysilicon layer 56. The material of the dielectric layer 54 comprises silicon oxide, silicon oxide/silicon nitride, tantalum oxide and other dielectric materials. In addition, to use second polysilicon layer 56 as the upper electrode layer, it comprises titanium nitride, tungsten silicon, aluminum, copper, tungsten or other conductive materials.

Figure 2E:
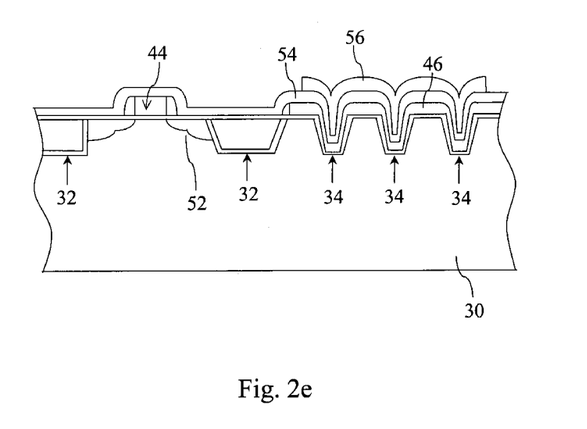

Next, a second patterned photoresist layer 58 is formed on the semiconductor substrate 30 to cover second shallow trench isolation regions 34, exposing first shallow trench isolation region 32 and the devices thereon which do not belong to the capacitor, as shown in FIG. 2d. Using the second patterned photoresist layer as a mask, the exposed second polysilicon layer 56 is removed by dry etching, as shown in FIG. 2e. Finally, second patterned photoresist layer 58 is removed by etching to form a trench capacitor on first polysilicon layer 46, the dielectric layer 54 and the second polysilicon layer 56 in the shallow trench structure 42. This trench capacitor is formed in the shallow trench structure 42 by PIP. Subsequent to removing the exposed upper electrode layer, the exposed dielectric layer may be removed through dry etching or some like technique.

Figure 3:
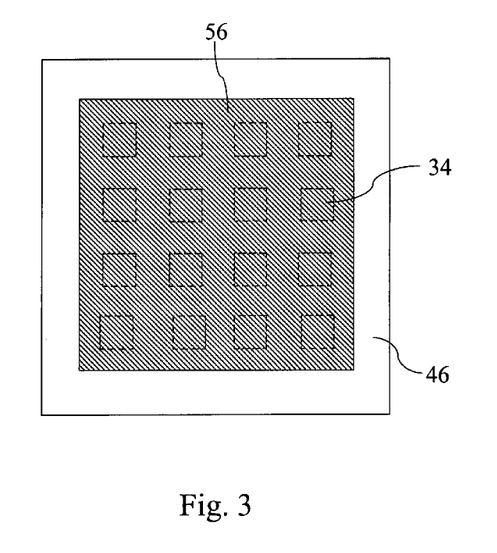
FIG. 3 is a top view of a trench capacitor fabricated by an embodiment of the present invention.

Refer to FIG. 3, which is a top view of a trench capacitor fabricated by an embodiment of the present invention. First polysilicon layer 46 is extended to the outside of the trench capacitor used for the lower electrode of the capacitor and the external line.

The present invention provides a method of fabricating a trench capacitor of a mixed mode integrated circuit, which is a simplified and easy to control process. The trench capacitor is formed in the shallow trench by stacking PIP or PIM. The trench capacitor substitutes for the 3-dimensional structure capacitor of the conventional process to effectively reduce the heights of the lower electrode and the peripheral circuit, resulting in increasing the surface area of the electrode and reducing the difficulty in the subsequent process.

The embodiment above is only intended to illustrate the present invention; it does not, however, to limit the present invention to the specific embodiment. Accordingly, various modifications and changes may be made without departing from the spirit and scope of the present invention as described in the following claims.

What is claimed is:

1. A method of fabricating a trench capacitor of a mixed mode integrated circuit, comprising:
   forming a first shallow trench isolation region and a second shallow trench isolation region in a semiconductor substrate, wherein the first shallow trench isolation region is used for isolating an active device and a passive device;
   forming a first patterned photoresist layer on the semiconductor substrate to expose the second shallow isolation region only, removing oxide in the second shallow trench isolation region by using the first patterned photoresist layer as a mask to leave a plurality of shallow trenches, removing the first patterned photoresist layer;
   forming a gate structure and a source/drain region of semiconductor basic devices in sequence on the first shallow trench isolation region, and forming a polysilicon layer on the second shallow trench isolation region used as a lower electrode layer while forming the gate structure;
   forming a dielectric layer and an upper electrode layer in sequence on the semiconductor substrate;
   forming a second patterned photoresist layer on the semiconductor substrate to cover the second shallow trench isolation region and to expose devices on the first shallow trench isolation region; and
   removing the exposed upper electrode layer by using the second patterned photoresist layer as a mask to form the trench capacitor on the upper electrode layer, the dielectric layer and the polysilicon layer in the trench.

2. The method of fabricating a trench capacitor of a mixed mode integrated circuit of claim 1, wherein forming the gate structure and the source/drain region of semiconductor basic devices further comprises:

forming a gate structure on the semiconductor substrate, wherein the gate structure includes a gate oxide layer and a polysilicon layer thereon;

performing an ion implantation with low concentration using the gate structure as a mask, thereby forming a lightly doped drain region in the semiconductor substrate;

forming gate spacers on the sidewalls of the gate structure;

performing a high-temperature activation treatment;

performing an ion implantation with high concentration using the gate structure and the gate spacers as a mask, thereby forming a heavily doped drain region in the semiconductor substrate; and performing a thermal annealing on the semiconductor substrate.

3. The method of fabricating a trench capacitor of a mixed mode integrated circuit of claim 1, wherein the oxide in the second shallow trench isolation region comprises a dielectric oxide layer and a liner oxide layer.

4. The method of fabricating a trench capacitor of a mixed mode integrated circuit of claim 1, wherein the oxide in the second shallow trench isolation region is removed by wet etching.

5. The method of fabricating a trench capacitor of a mixed mode integrated circuit of claim 1, wherein the material of the dielectric layer is selected from the group consisting of silicon oxide, silicon oxide/silicon nitride, tantalum oxide and other dielectric materials.

6. The method of fabricating a trench capacitor of a mixed mode integrated circuit of claim 1, wherein the material of the upper electrode layer is selected from conductive material consisting of polysilicon, titanium nitride, tungsten silicon, aluminum, copper and tungsten.

7. The method of fabricating a trench capacitor of a mixed mode integrated circuit of claim 1, wherein the upper electrode layer is removed by dry etching.

8. The method of fabricating a trench capacitor of a mixed mode integrated circuit of claim 1, wherein after removing the exposed upper electrode layer, further removing the exposed dielectric layer.

9. The method of fabricating a trench capacitor of a mixed mode integrated circuit of claim 8, wherein the dielectric layer is removed by dry etching.

* * * * *